(12) United States Patent
Zhou et al.

(10) Patent No.: US 12,339,810 B2
(45) Date of Patent: Jun. 24, 2025

(54) DATA COMPRESSION METHOD AND COMPUTING DEVICE

(71) Applicant: HUAWEI TECHNOLOGIES CO.,LTD., Guangdong (CN)

(72) Inventors: Wen Zhou, Shanghai (CN); Zhongquan Liu, Shenzhen (CN); Litian Sun, Shanghai (CN); Hongfeng Jiang, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 156 days.

(21) Appl. No.: 17/543,635

(22) Filed: Dec. 6, 2021

(65) Prior Publication Data

US 2022/0092031 A1    Mar. 24, 2022

Related U.S. Application Data

(63) Continuation of application No. PCT/CN2020/136231, filed on Dec. 14, 2020.

(30) Foreign Application Priority Data

Dec. 28, 2019  (CN) .......................... 201911385235.5
Apr. 4, 2020   (CN) .......................... 202010261686.6

(51) Int. Cl.
*G06F 16/174* (2019.01)
*G06N 5/022* (2023.01)

(52) U.S. Cl.
CPC ......... *G06F 16/1744* (2019.01); *G06N 5/022* (2013.01)

(58) Field of Classification Search
CPC ............................. G06F 16/1744; G06N 5/022

USPC ......................................................... 707/693
See application file for complete search history.

(56) References Cited

U.S. PATENT DOCUMENTS

| 5,941,938 | A | 8/1999 | Thayer | |
|---|---|---|---|---|
| 7,051,126 | B1* | 5/2006 | Franklin | H03M 7/3084 710/68 |
| 8,396,841 | B1* | 3/2013 | Janakiraman | G06F 3/0608 707/802 |
| 8,429,111 | B1 | 4/2013 | Kailash et al. | |
| 10,459,954 | B1 | 10/2019 | Walters et al. | |

(Continued)

FOREIGN PATENT DOCUMENTS

| CN | 105553937 A | 5/2016 |
|---|---|---|
| CN | 107066401 A | 8/2017 |

(Continued)

OTHER PUBLICATIONS

Goyal Mohit et al: "DeepZip: Lossless Data Compression Using Recurrent Neural Networks", 2019 Data Compression Conference (DCC), Mar. 1, 2019, XP055922677, total 9 pages.

(Continued)

*Primary Examiner* — Cam Linh T Nguyen

(57) ABSTRACT

This application discloses a data compression method and a computing device. The disclosed method is applied to the computing device. The method includes receiving, by the computing device, to-be-compressed data, and identifying a data type of the to-be-compressed data. The method further includes selecting one or more data compression models based on the identified data type and compressing the to-be-compressed data based on the selected one or more data compression models.

15 Claims, 3 Drawing Sheets

(56) References Cited

U.S. PATENT DOCUMENTS

| | | |
|---|---|---|
| 10,554,220 B1 * | 2/2020 | Constantinescu ..... H03M 7/607 |
| 11,093,342 B1 * | 8/2021 | Heyman ............. H03M 7/3064 |
| 2002/0097172 A1 | 7/2002 | Fallon |
| 2004/0160353 A1 * | 8/2004 | Cirillo ..................... H03M 7/30 |
| | | 342/25 R |
| 2007/0043753 A1 * | 2/2007 | Basin ..................... H03M 7/30 |
| 2007/0233477 A1 * | 10/2007 | Halowani ............... H03M 7/30 |
| | | 704/232 |
| 2010/0161523 A1 * | 6/2010 | Li ..................... H04L 12/6418 |
| | | 706/14 |
| 2010/0257147 A1 * | 10/2010 | De Peuter ............... H03M 7/30 |
| | | 707/693 |
| 2012/0109911 A1 * | 5/2012 | Elzinga ................. G06F 40/146 |
| | | 707/693 |
| 2013/0275396 A1 * | 10/2013 | Condict .................. H03M 7/30 |
| | | 707/693 |
| 2014/0208068 A1 * | 7/2014 | Wegener ............. H03M 7/3059 |
| | | 712/22 |
| 2017/0244967 A1 * | 8/2017 | Wang ..................... H04N 19/91 |
| 2018/0138921 A1 * | 5/2018 | Arelakis ............... H03M 7/30 |
| 2018/0191370 A1 * | 7/2018 | Li ....................... H03M 7/6064 |
| 2018/0309841 A1 * | 10/2018 | Hochberg ............... H04L 69/22 |
| 2019/0026637 A1 | 1/2019 | Mehta |
| 2019/0081637 A1 | 3/2019 | Pool |
| 2019/0220533 A1 | 7/2019 | Guisado |
| 2020/0128307 A1 * | 4/2020 | Li ........................ H04N 19/119 |
| 2022/0121936 A1 * | 4/2022 | Sui ........................ G06N 3/045 |

FOREIGN PATENT DOCUMENTS

| | | |
|---|---|---|
| CN | 107204184 A | 9/2017 |
| CN | 110196836 A | 9/2019 |
| CN | 110309300 A | 10/2019 |
| CN | 110532466 A | 12/2019 |
| CN | 110545107 A | 12/2019 |
| EP | 1422828 A1 | 5/2004 |
| JP | 2005347780 A | 12/2005 |
| JP | 2014039256 A | 2/2014 |
| JP | 2018522457 A | 8/2018 |
| WO | 2002048870 | 6/2002 |

OTHER PUBLICATIONS

Knoll Byron: "CMIX", Dec. 19, 2019 (Dec. 19, 2019), pp. 1-8, XP055923489, total 8 pages.

Jun Han et al: "Deep Generative Video Compression", arxiv.org, Cornell University Library, 201 Olin Library Cornell University Ithaca, NY 14853, 2019, XP081561765, total 15 pages.

* cited by examiner

DATA COMPRESSION METHOD AND COMPUTING DEVICE

CROSS-REFERENCE TO RELATED APPLICATIONS

This application is a continuation of International Application No. PCT/CN2020/136231, filed on Dec. 14, 2020, which claims priority to Chinese Patent Application No. 202010261686.5 filed on Apr. 4, 2020 and Chinese Patent Application No. 201911385235.6, filed on Dec. 28, 2019. All of which are hereby incorporated by reference in their entireties.

TECHNICAL FIELD

This application relates to the data compression field, and in particular, to a data compression method and a computing device.

BACKGROUND

Generally, to reduce data storage costs, a processor may compress original data based on a data compression algorithm, to be specific, reconstruct the original data according to a specific method to reduce data redundancy and reduce a storage capacity occupied by the original data. Commonly used data compression algorithms include dictionary encoding and entropy encoding. Arithmetic encoding is an entropy encoding technology with a highest compression rate in the entropy encoding. The so-called arithmetic encoding is encoding a probability of each bit in the original data into a value in a range from 0 to 1. According to the information theory proposed by Shannon, the closer a predicted value of information is to real probability distribution, the higher a compression rate of the arithmetic encoding is. Currently, the processor predicts the probability of each bit in the original data based on a large quantity of data compression models, and then compresses to-be-compressed data based on a probability of the to-be-compressed data to obtain the compressed data. Consequently, memory overheads for performing data compression by the processor through the arithmetic encoding are relatively large, and an encoding time is relatively long. Therefore, how to reduce memory overheads and time overheads for performing data compression through the arithmetic encoding is an urgent problem to be resolved.

SUMMARY

This application provides a data compression method and a computing device, to resolve a problem of how to reduce memory overheads and time overheads for performing data compression through arithmetic encoding.

To achieve the foregoing objectives, the following technical solutions are used in this application.

According to a first aspect, this application provides a data compression method. The method is applied to a computing device, and the method includes: receiving to-be-compressed data, and identifying a data type of the to-be-compressed data; selecting one or more data compression models based on the data type; and compressing the to-be-compressed data based on the selected one or more data compression models.

For example, the data type includes but is not limited to a text type, a picture type, a video type, and the like. Each data type corresponds to a data compression model. For example, a data compression model corresponding to the text type is a text model, a word model, or a nest model; a data compression model corresponding to the picture type is a record model, a picture type, or a picture format jpeg model; and a data compression model corresponding to the video type is a record model, a way model, or a sparse model. It may be understood that each data type corresponds to more than one data compression model.

In this application, the data type of the to-be-compressed data is identified instead of compressing the to-be-compressed data based on all data compression models, and an applicable data compression model is selected based on the data type of the to-be-compressed data, to compress the to-be-compressed data based on the selected data compression model. A quantity of selected data compression models that match the data type is less than a quantity of data compression models for performing data compression through arithmetic encoding in the conventional technology. Therefore, memory overheads and time overheads for performing data compression through arithmetic encoding are reduced.

Optionally, the method provided in the first aspect may be performed by a first processor in the computing device, and the first processor is mainly a central processing unit. Alternatively, the method may be jointly performed by a first processor and a second processor. The second processor is also located inside the computing device, has a computing capability, is configured to undertake a data compression function, and is referred to as a coprocessor. The coprocessor is used to share a data compression operation, so that calculation burden of the first processor can be further reduced. Specifically, the first processor receives the to-be-compressed data, and identifies the data type of the to-be-compressed data; and selects the one or more data compression models based on the data type. The second processor compresses the to-be-compressed data based on the selected data compression model.

In a possible implementation, before the compressing the to-be-compressed data based on the data compression model, the method further includes: training first sample data to generate several data compression models; and storing the several data compression models or a subset of the several data compression models in the computing device, to compress the to-be-compressed data based on the data compression model.

The subset of the several data compression models refers to some data compression models that have a basic compression function and that are selected from the several data compression models. A function of another data compression model may be implemented by combining these data compression models that have the basic compression function.

Optionally, an artificial intelligence (AI) chip may be disposed in the computing device, and the artificial intelligence chip trains the first sample data to generate the several data compression models. Optionally, no artificial intelligence chip may be disposed in the computing device, and the first processor or the second processor trains the first sample data to generate the several data compression models. If the artificial intelligence chip is disposed, and the artificial intelligence chip trains the first sample data to generate the several data compression models, calculation burden of the first processor or the second processor in the computing device can be further reduced.

Specifically, at least three implementations are included herein. Implementation (1): The several data compression models or the subset of the several data compression models are/is stored in a memory of the computing device, and the first processor and/or the second processor may obtain, from the memory, a data compression model that matches the data type of the to-be-compressed data. Implementation (2): The second processor has a cache of the second processor, the several data compression models or the subset of the several data compression models are/is stored in the cache of the second processor, and the second processor may obtain, from the cache of the second processor, a data compression model that matches the data type of the to-be-compressed data. Implementation (3): Because the second processor is a processing chip, the several data compression models or the subset of the several data compression models may be placed into the processing chip during processing chip manufacturing, so that the processing chip can load functions of the models. In Implementation (2) or (3), an identifier of each data compression model may be stored in the memory of the computing device and the cache of the second processor (or placed into the second processor during chip manufacturing, so that the chip can load the functions of the models). Therefore, after selecting the data compression model that matches the data type, the first processor may send an identifier of the data compression model to the second processor, and the second processor obtains the data compression model based on the identifier of the data compression model.

Optionally, the method further includes: upgrading the data compression model stored in the computing device. "Upgrading" herein refers to adding a new data compression model, eliminating a data compression model that is not used or is not frequently used, or updating one or more of the data compression models.

Optionally, the method further includes: training second sample data to generate M data type identification models. An operation of training the second sample data may be completed by the artificial intelligence chip described above, or may be completed by the first processor or the second processor.

In another possible implementation, the computing device stores the M data type identification models, and each data type identification model is used to identify occurrence probabilities of P data types. The identifying a data type of the to-be-compressed data including: determining, based on the M data type identification models, M probability sets corresponding to the to-be-compressed data, where each probability set includes P initial probability values, each of the P initial probability values is used to indicate a possibility that the to-be-compressed data is of a data type, M is an integer greater than or equal to 1, and P is an integer greater than or equal to 1; and determining the data type of the to-be-compressed data based on the M probability sets.

Therefore, the computing device may identify, based on the data type, probabilities that are of a plurality of possible data types of the to-be-compressed data and that are output by the models, and further determine the data type of the to-be-compressed data based on the probabilities of the plurality of possible data types, so that the computing device determines the applicable data compression model based on the data type of the to-be-compressed data, and performs data compression on the to-be-compressed data based on the applicable data compression model. The quantity of selected data compression models that match the data type is less than the quantity of data compression models for performing data compression through arithmetic encoding in the conventional technology. Therefore, the memory overheads and the time overheads for performing data compression through arithmetic encoding are reduced.

In addition, accuracies of identifying different data types by different data type identification models may be different. In this application, a plurality of data type identification models are used to output different probabilities of the plurality of possible data types of the to-be-compressed data, and the data type of the to-be-compressed data is determined based on the different probabilities of the plurality of possible data types, to increase an accuracy rate of identifying the data type of the to-be-compressed data.

Optionally, the determining the data type of the to-be-compressed data based on the M probability sets includes: obtaining P intermediate values based on the M probability sets and weight ratios of the M data type identification models; and determining, as the data type of the to-be-compressed data, a data type corresponding to an intermediate value that is in the P intermediate values and that is greater than an accuracy threshold.

In this application, the intermediate value of the data type of the to-be-compressed data is determined based on the weight ratios of the data type identification models and the different probabilities of the plurality of possible data types, and the data type of the to-be-compressed data is determined based on the accuracy threshold and the intermediate value, to increase the accuracy rate of identifying the data type of the to-be-compressed data.

According to a second aspect, this application provides a computing device. The computing device includes one or more processors, and the one or more processors are configured to: receive to-be-compressed data, and identify a data type of the to-be-compressed data; select one or more data compression models based on the data type; and compress the to-be-compressed data based on the selected one or more data compression models.

In a possible implementation, the one or more processors include a first processor and a second processor. The first processor is configured to: receive the to-be-compressed data, and identify the data type of the to-be-compressed data; and select the one or more data compression models based on the data type. The second processor is configured to compress the to-be-compressed data based on the selected one or more data compression models. Therefore, because a data compression process is executed by another processor, compression performance of arithmetic encoding is effectively improved.

Optionally, the first processor is a central processing unit, and the second processor is a coprocessor.

In another possible implementation, the computing device further includes an AI chip, and the AI chip is configured to train first sample data to generate several data compression models. The first processor is further configured to store the several data compression models or a subset of the several data compression models in the computing device.

Optionally, the first processor or the second processor is further configured to upgrade the data compression model stored in the computing device.

In another possible implementation, the AI chip is further configured to train second sample data to generate M data type identification models.

In another possible implementation, each data compression model has an identifier, and the first processor is further configured to send an identifier of the selected data compression model to the second processor. The second processor is further configured to obtain a corresponding data compression model based on the identifier.

In another possible implementation, the computing device stores the M data type identification models, and each data type identification model is used to identify occurrence probabilities of P data types. The first processor is specifically configured to: determine, based on the M data type identification models, M probability sets corresponding to the to-be-compressed data, where each probability set includes P initial probability values, each of the P initial probability values is used to indicate a possibility that the to-be-compressed data is of a data type, M is an integer greater than or equal to 1, and P is an integer greater than or equal to 1; and determine the data type of the to-be-compressed data based on the M probability sets.

Optionally, the first processor is specifically configured to: obtain P intermediate values based on the M probability sets and weight ratios of the M data type identification models; and determine, as the data type of the to-be-compressed data, a data type corresponding to an intermediate value that is in the P intermediate values and that is greater than an accuracy threshold.

According to a third aspect, an embodiment of this application further provides a data compression apparatus. For beneficial effects, refer to the descriptions of the first aspect, and details are not described herein again. The data compression apparatus has a function of implementing an action in an example in the first aspect. The function may be implemented by hardware, or may be implemented by hardware executing corresponding software. The hardware or software includes one or more modules corresponding to the function. In a possible design, the data compression apparatus includes a first processing module and a second processing module. The first processing module is configured to: receive to-be-compressed data, and identify a data type of the to-be-compressed data; and select one or more data compression models based on the data type. The second processing module is configured to compress the to-be-compressed data based on the selected one or more data compression models. The first processing module may implement a function of the first processor. The second processing module may implement a function of the second processor. These modules may perform corresponding functions in the method example in the first aspect. For details, refer to the detailed descriptions in the example, and details are not described herein again.

Optionally, the data compression apparatus further includes a storage module, and the first processing module is further configured to store a correspondence between the data type of the to-be-compressed data and the one or more data compression models in the storage module. The storage module may be a cache in the computing device, a cache of the second processor, or another component having a storage function.

Optionally, the data compression apparatus further includes an AI chip, and the AI chip is configured to train first sample data to generate several data compression models. The first processing module is further configured to store the several data compression models or a subset of the several data compression models in the computing device.

Optionally, the first processing module or the second processing module is further configured to upgrade the data compression model stored in the computing device.

Optionally, each data compression model has an identifier, and the first processing module is further configured to send an identifier of the selected data compression model to the second processing module. The second processing module is further configured to obtain a corresponding data compression model based on the identifier.

Optionally, the computing device stores M data type identification models, and each data type identification model is used to identify occurrence probabilities of P data types. The first processing module is specifically configured to: determine, based on the M data type identification models, M probability sets corresponding to the to-be-compressed data, where each probability set includes P initial probability values, each of the P initial probability values is used to indicate a possibility that the to-be-compressed data is of a data type, M is an integer greater than or equal to 1, and P is an integer greater than or equal to 1; and determine the data type of the to-be-compressed data based on the M probability sets.

Optionally, the first processing module is specifically configured to: obtain P intermediate values based on the M probability sets and weight ratios of the M data type identification models; and determine, as the data type of the to-be-compressed data, a data type corresponding to an intermediate value that is in the P intermediate values and that is greater than an accuracy threshold.

According to a fourth aspect, a data compression method is provided. The method is applied to a computing device, and the computing device includes a first processor and a second processor. The first processor is configured to receive to-be-compressed data, and the second processor is configured to compress the to-be-compressed data.

Compared with the data compression method provided in the first aspect, in the method provided in the fourth aspect, the data compression model is not screened based on the data type of the to-be-compressed data, and only the second processor is specially configured to process a compression operation. Therefore, the first processor can be released to process another data service. This reduces calculation burden of the first processor.

The first processor and the second processor are consistent with those described in the first aspect, and details are not described herein again.

According to a fifth aspect, a computing device is provided, configured to perform the data compression method provided in the fourth aspect.

According to a sixth aspect, a computer program product is provided. The computer program product includes computer program code, and when the computer program code is run, the methods performed by the computing device in the foregoing aspects are performed.

According to a seventh aspect, this application provides a chip system. The chip system includes a processor, configured to implement functions of the computing device in the methods in the foregoing aspects. In a possible design, the chip system further includes a memory, configured to store program instructions and/or data. The chip system may include a chip, or may include a chip and another discrete component.

According to an eighth aspect, this application provides a computer-readable storage medium. The computer-readable storage medium stores computer programs. When the computer programs are run, the methods performed by the computing device in the foregoing aspects are implemented.

In this application, names of the computing device and the data compression apparatus constitute no limitation on the device itself. In an actual implementation, the devices may have other names provided that functions of the devices are similar to those in this application, and the devices fall within the scope of the claims of this application and their equivalent technologies.

DESCRIPTION OF EMBODIMENTS

In the specification, claims, and accompanying drawings of this application, the terms "first", "second", "third" and the like are intended to distinguish between different objects but do not limit a particular sequence.

In the embodiments of this application, the word "example" or "for example" is used to represent giving an example, an illustration, or a description. Any embodiment or design scheme described as an "example" or "for example" in the embodiments of this application should not be explained as being more preferred or having more advantages than another embodiment or design scheme. Exactly, use of the word "example", "for example", or the like is intended to present a relative concept in a specific manner.

The following describes implementations of the embodiments of this application in detail with reference to the accompanying drawings.

Figure 1:
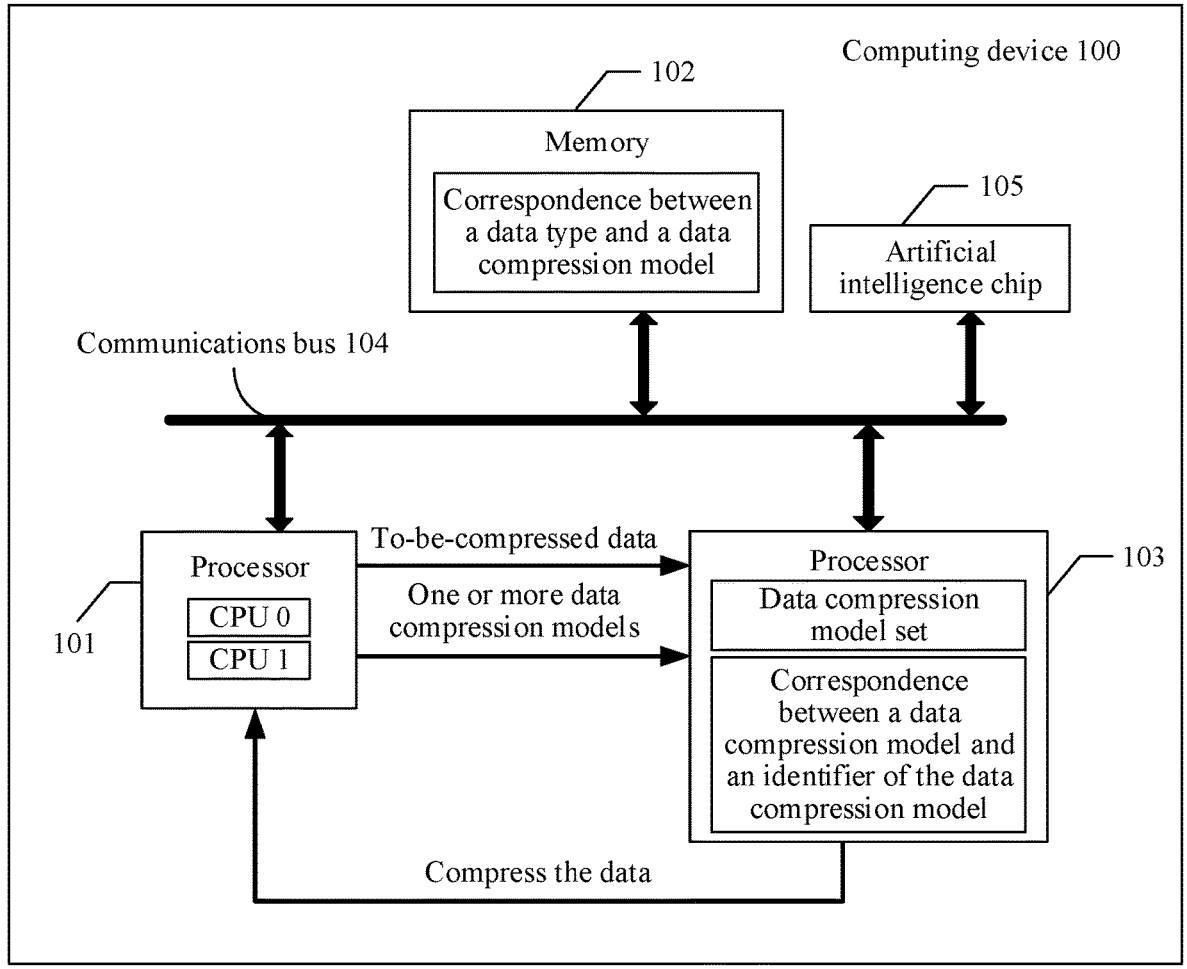
FIG. 1 is a schematic composition diagram of a computing device according to an embodiment of this application.

FIG. 1 is a schematic composition diagram of a computing device 100 according to an embodiment of this application. As shown in FIG. 1, the computing device 100 may include a processor 101, a memory 102, a processor 103, and a communications bus 104.

The following describes each component of the computing device 100 in detail with reference to FIG. 1.

The computing device 100 may include a plurality of processors, for example, the processor 101 and the processor 103 shown in FIG. 1. The processor 101 is a control center of the computing device. Generally, the processor 101 is a central processing unit (central processing unit, CPU), and includes one or more CPU cores, for example, a CPU 0 and a CPU 1 shown in FIG. 1. In addition, the processor 101 may alternatively be an application-specific integrated circuit (application-specific integrated circuit, ASIC), or may be configured as one or more integrated circuits, for example, one or more microprocessors, such as digital signal processor (DSP) or one or more field programmable gate arrays (FPGA). The processor 101 may perform various functions of the computing device 100 by running or executing software programs stored in the memory 102, and invoking data stored in the memory 102.

The processor 103 may be a processor that has a same physical form as the processor 101, or may be a processor that has a different physical form from the processor 101. However, the processor 103 is a processing chip having a computing capability, and is configured to bear a data compression function, to reduce computational load of the processor 101. In this embodiment of this application, the processor 103 is configured to assist the processor 101 in compressing to-be-compressed data. For example, the processor 103 compresses the to-be-compressed data based on one or more data compression models indicated by the processor 101. In an actual application, the processor 103 may be an acceleration card, a coprocessor, a graphics processing unit (GPU), a neural processing unit (NPU), or the like. In this embodiment, one or more processors 101 may be configured, and one or more processors 103 may also be configured. However, it should be noted that the processor 103 is an optional component in this embodiment. Even if there is only one processor 101, the processor 101 can independently receive the to-be-compressed data, and identify a data type of the to-be-compressed data; select the one or more data compression models based on the data type; and then compress the to-be-compressed data based on the one or more data compression models. When the computing device 100 includes both the processor 101 and the processor 103, the processor 101 and the processor 103 may cooperate to complete the foregoing operations. For example, the processor 101 is mainly configured to: receive the to-be-compressed data, and identify the data type of the to-be-compressed data; select the one or more data compression models based on the data type; and then send the to-be-compressed data to the processor 103, and indicate the processor 103 to compress the to-be-compressed data based on the selected one or more data compression models.

Both the processor 101 and the processor 103 may access the memory 102 through the communications bus 104. The memory 102 stores a data compression model set, and the data compression model set includes a plurality of data compression models. In addition, the memory 102 further stores a correspondence between the data type of the to-be-compressed data and the one or more data compression models. It may be understood that the correspondence may be a correspondence between the data type of the to-be-compressed data and all of the one or more data compression models. Alternatively, the correspondence may be a correspondence between the data type of the to-be-compressed data and each data compression model in the one or more data compression models. The processor 101 may invoke the correspondence from the memory 102, and select the one or more data compression models based on the data type and the correspondence.

Generally, different data compression models may be designed for different data types. Therefore, the data compression models may be classified based on the different data types. The memory 102 may store a correspondence between another data type and the one or more data compression models. A quantity of correspondences between the data type and the data compression models is not limited in this application.

In addition, the memory 102 is further configured to store the software programs for performing the solution in this application, and the processor 101 controls execution of the software programs.

In a physical form, the memory 102 may be a read-only memory (ROM) or another type of static storage device that can store static information and instructions, or a random access memory (RAM) or another type of dynamic storage device that can store information and instructions. The memory 102 may alternatively be an electrically erasable programmable read-only memory (EEPROM), a compact disc read-only memory (CD-ROM) or another compact disc storage, an optical disc storage (including a compact disc, a laser disc, an optical disc, a digital versatile disc, a Blu-ray disc, or the like), a magnetic disk storage medium or another magnetic storage device, or any other medium that can be used to carry or store expected program code in a form of an instruction or a data structure and that is accessible by a computer. However, the memory 102 is not limited thereto. The memory 102 may exist independently and is connected to the processor 101 through the communications bus 104. Alternatively, the memory 102 may be integrated with the processor 101. This is not limited.

For a source of the data compression model, this embodiment provides at least two implementations. In one implementation, a commonly used data compression model is screened out from all data compression models in a conventional technology, or another data compression model generated by combining commonly used data compression models is used as the data compression model. The another data compression model generated by combining commonly used data compression models mainly refer to a higher-order data compression model generated by combining low-order data compression models.

These commonly used data compression models include but are not limited to: a nest model, a context model, an indirect model, a text model, a sparse model, an extensible markup language model (XML model), a match model, a distance model, an executable program model (exe model), a word model, a record model, a picture type, a prediction by partial matching model (PPM model), a dynamic Markov compression model (DMC model), a byte model, a linear prediction model, an adaptive prediction model, a way model, and a common model. The nest model is a model for predicting a subsequent byte based on information about a nested symbol that appears in a to-be-predicted byte. The context model is a model for predicting a subsequent byte based on a context of consecutive bytes that appear before a to-be-predicted byte. The indirect model is a model for predicting a subsequent byte based on historical information of bits of first one or two bytes of a to-be-predicted byte and a context. The text model is a model for predicting a subsequent byte based on information such as a word, a sentence, and a paragraph. Generally, the text model is used to predict text data. The sparse model is a model for predicting a subsequent byte by searching for discontinuous bytes before a to-be-predicted byte and using the discontinuous bytes as a context, for example, a model for predicting a subsequent byte by searching for one byte and three bytes before a to-be-predicted byte. The extensible markup language model is a model for predicting a subsequent byte based on feature information included in a to-be-predicted byte, for example, a label. The match model is a model for predicting a subsequent byte based on matching information after searching whether there is the matching information in a context before a to-be-predicted byte. The distance model is a model for predicting a subsequent byte based on a current to-be-predicted byte and some special bytes. For example, the special byte is a distance of a space character. The executable program model is a model for predicting a subsequent byte based on a specific instruction set and a specific operation code. The word model is a context model for predicting a subsequent byte based on information about a word that appears. The record model is a context model for predicting a subsequent byte by searching for row and column information in a file. In a table, a row is referred to as a record, and the record is usually used in a database and a table. The picture type is a context model for predicting a subsequent byte based on a feature of a picture, for example, a context model for predicting a subsequent byte based on grayscale or a pixel of a picture. The prediction by partial matching model is a model for prediction by performing searching and matching in a to-be-predicted byte based on a plurality of bytes that continuously appear before the to-be-predicted byte, reducing some bytes in the plurality of bytes and if no new byte is found, and then performing searching and matching based on bytes obtained after reduction until a new byte is found or recorded. The dynamic Markov compression model is a model for predicting a next bit based on a variable-length bit-level context history table. The byte model is a model for predicting a subsequent bit based on historical information of a bit. The linear prediction model is a context model for predicting a subsequent byte based on linear regression analysis. The adaptive model is a model for adjusting a calculated probability based on the probability calculated by another model and a known context. The way model is a context model for predicting a subsequent byte based on feature information in an audio file. The common model is a model for performing probability prediction on data of a new data type or data of an unidentified data type. The common model may be generated by combining a plurality of other models. Because the data compression model set includes screened data compression models, and a quantity of screened data compression models is far less than a quantity of originally used data compression models, an occupied storage space is relatively low. The data compression model set may be stored in the processor 103, and the processor 103 completes a data compression operation. In this way, calculation burden of the processor 101 is reduced, and memory overheads and time overheads are reduced.

In some embodiments, the correspondence between the data type and the data compression model may be presented in a form of a table. To be specific, Table 1 presents the correspondence between the data type and the data compression model. After identifying the data type of the to-be-compressed data, the processor 101 may determine, by querying Table 1, the one or more data compression models corresponding to the data type of the to-be-compressed data.

TABLE 1

| Data type | Data compression model |
| --- | --- |
| Text type | Text model (text model) |
| | Word model (word model) |
| | Nest model (nest model) |
| Executable-program type | Executable program model (exe model) |
| | Sparse model (sparse model) |
| Picture type | Record model (record model) |
| | Picture type (picture type) |
| | Picture format jpeg model (jpeg model) |
| Video type | Record model (record model) |
| | Wav model (wav model) |
| | Sparse model (sparse model) |
| Database type | Record model (record model) |
| | Text model (text model) |
| | Sparse model (sparse model) |
| Another (common) type | Text model (text model) |
| | Sparse model (sparse model) |
| | Record model (record model) |

It can be learned from Table 1 that the text type corresponds to the text model, the word model, and the nest model. If the processor 101 determines that the data type of the to-be-compressed data is the text type, the processor 101 may learn, by querying Table 1, that the text type corresponds to the text model, the word model, and the nest model, and compress the to-be-compressed data based on the text model, the word model, and the nest model.

The executable-program type corresponds to the executable program model and the sparse model. If the processor 101 determines that the data type of the to-be-compressed data is the executable-program type, the processor 101 may learn, by querying Table 1, that the executable-program type corresponds to the executable program model and the sparse model, and compress the to-be-compressed data based on the executable program model and the sparse model.

If the processor 101 does not identify the data type of the to-be-compressed data, and determines that the data type of the to-be-compressed data is the another (common) type, the processor 101 may learn, by querying Table 1, that the another (common) type corresponds to the text model, the sparse model, and the record model, and compress the to-be-compressed data based on the text model, the sparse model, and the record model.

It should be noted that Table 1 merely shows, in the form of a table, a form in which the correspondence between the data type and the data compression model is stored in the storage device, and does not limit the form in which the correspondence between the data type and the data compression model is stored in the storage device. Certainly, the correspondence between the data type and the data compression model may be stored in the storage device in another form. This is not limited in this embodiment of this application.

Specifically, the data compression model set may be stored in the processor 103 in a software manner. For example, the data compression models included in the data compression model set are stored in the memory built in or coupled to the processor 103. Optionally, the data compression model set may alternatively be stored in the processor 103 in a hardware manner. For example, the data compression model set is placed, by designing a circuit structure of the processor 103, into the processor 103 during processor manufacturing, so that the processor 103 can load functions of the models.

With development of science and technology, if new data types are generated, the foregoing data compression model set is upgraded. For example, data compression models corresponding to the new data types are stored in the processor 103. The new data types include a data type of gene data and a data type of big data. A model that is less frequently used in existing data compression models may alternatively be eliminated, or one or more existing data compression models may be modified.

In some embodiments, a new data compression model may be generated by combining the existing data compression models, and the data compression model set stored in the processor 103 is updated in a software upgrade manner. For example, the higher-order data compression model may be implemented by combining the lower-order data compression models. Therefore, there is no need to change a hardware circuit again, and upgrade costs of the processor 103 are greatly reduced.

In other embodiments, different data compression models may be stored by designing the circuit structure of the processor 103. When the data compression model set is upgraded, the circuit structure of the processor 103 may be changed to upgrade the data compression model set. Because the processor 103 stores the commonly used data compression models, even if the data compression model set is upgraded, the hardware circuit is slightly changed, and upgrade costs are relatively low.

In still another implementation, an artificial intelligence (AI) chip 105 is disposed in the computing device 100. The artificial intelligence chip 105 periodically trains received sample data to generate several data compression models; and stores these data compression models in the memory 102 through the communications bus 104, or transfers the data to the processor 103 for storage. A form of the artificial intelligence chip 105 may be a chip or another physical component. For example, the artificial intelligence chip 105 may be a training chip configured to construct a neural network model, or may be an inference chip configured to perform inference based on a neural network model. The neural network model may also be referred to as an artificial neural network, a neural network (NN), or a connection model. The so-called "artificial neural network" is an algorithmic mathematical model for processing distributed parallel information based on a structure similar to a structure connected by cerebral neural synapses. The artificial neural network processes information by adjusting a relationship between a large quantity of internal nodes depending on complexity of a system. Compared with the foregoing listed implementations, the sample data is periodically trained based on the artificial intelligence chip 105 to generate the several data compression models, to better adapt to a change of the data compression model.

In addition, each data compression model has an identifier, and the processor 103 further stores a correspondence between a data compression model and an identifier of the data compression model. Therefore, the processor 103 may obtain a corresponding data compression model based on an identifier that is of the data compression model and that is sent by the processor 101 to the processor 103, and compress the to-be-compressed data.

The communications bus 104 may be an industry standard architecture (ISA) bus, a peripheral component interconnect (PCI) bus, an extended industry standard architecture (EISA) bus, or the like. The bus may be classified into an address bus, a data bus, a control bus, and the like. For ease of representation, only one thick line is used to represent the bus in FIG. 1, but this does not mean that there is only one bus or only one type of bus.

A structure of the device shown in FIG. 1 does not constitute a limitation on the computing device. The computing device may include more or fewer components than those shown in the figure, or combine some components, or have a different component arrangement.

Figure 2:
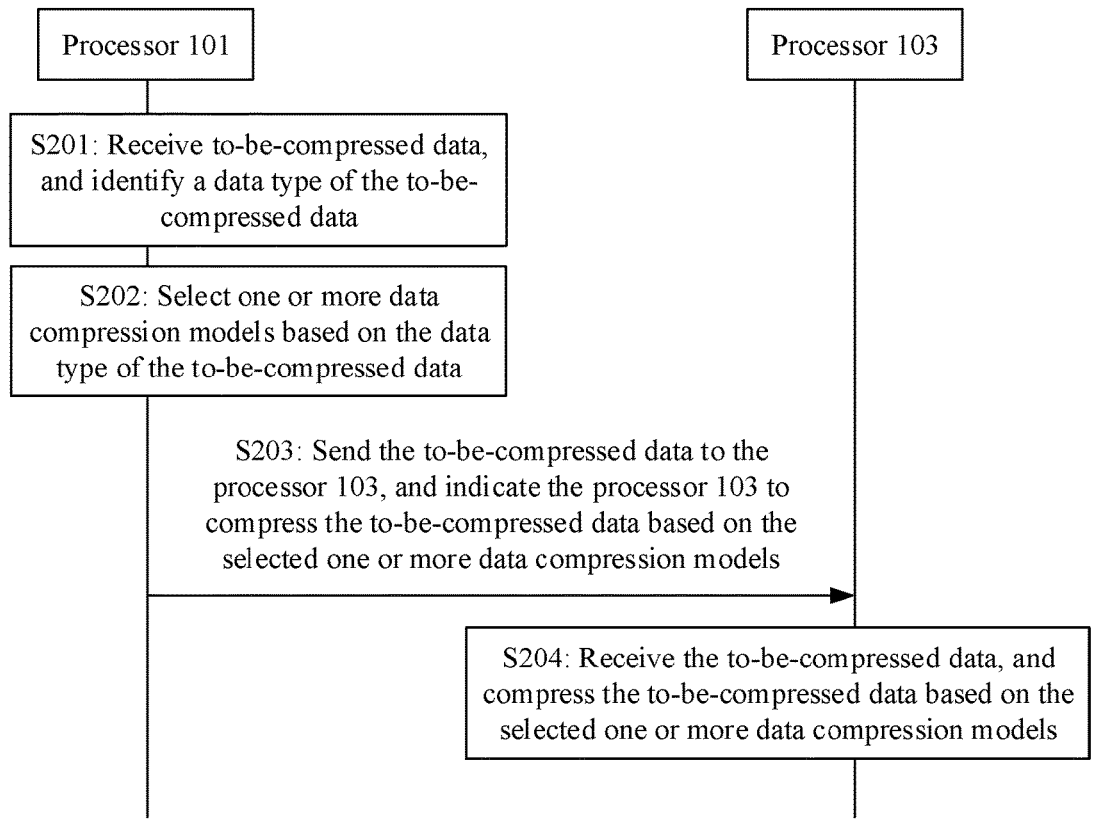
FIG. 2 is a flowchart of a data compression method according to an embodiment of this application.

The following describes in detail a data compression method provided in an embodiment of this application with reference to FIG. 2. The method is applied to the computing device 100 shown in FIG. 1. Herein, the processor 101 and the processor 103 are used as an example for description. As shown in FIG. 2, the method may include the following steps.

S201: The processor 101 receives to-be-compressed data, and identifies a data type of the to-be-compressed data.

Before the data type of the to-be-compressed data is identified, a large amount of sample data may be trained through machine learning or based on an artificial neural network (Artificial Neural Network, ANN), to obtain a data type identification model. Alternatively, the data type identification model may be obtained by training sample data by the artificial intelligence chip 105. The data type identification model is used to indicate a mapping relationship between the to-be-compressed data and the data type of the to-be-compressed data. Further, the processor 101 may identify the data type of the to-be-compressed data based on the data type identification model.

The data type identification model includes but is not limited to models such as a naïve Bayesian (NB) model, an extreme gradient boosting decision tree (XGBoost) model, a multilayer perceptron (MLP) model, and a combination of the foregoing models.

The sample data may come from a data block or a file fragment. The sample data includes but is not limited to text data, picture data, video data, gene data, an executable program data, virtual hard disk data, database data, and the like. Correspondingly, data types of the sample data include but are not limited to: a text type, a picture type, a video type, a gene type, an executable-program type, a virtual-hard-disk type, a database type, and the like.

Optionally, the sample data may be obtained from a database. Alternatively, the sample data may be open source data or test data.

In some embodiments, an identifier may be set for the sample data based on a known data type, and the sample data and the identifier of the sample data are input to the artificial neural network for training to obtain a data type identification model. For example, the sample data is the text data. An identifier may be set for the text data based on a file name extension, and the text data and the identifier of the text data are input to the artificial neural network for training to obtain a mapping relationship between the text data and the text type.

Figure 3:
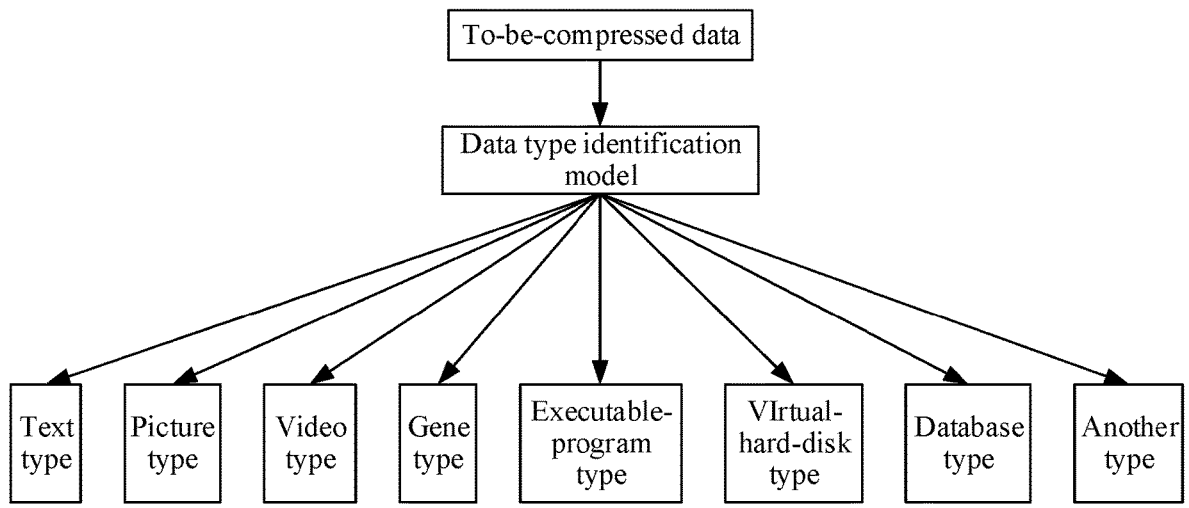
FIG. 3 is a schematic diagram of a data type identification model according to an embodiment of this application.

For example, FIG. 3 is a schematic diagram of a data type identification model according to an embodiment of this application. The to-be-compressed data is input into the data type identification model, and the text type, the picture type, the video type, the gene type, the executable-program type, the virtual-hard-disk type, the database type, and another type may be identified. The another type may be a common type.

In this embodiment of this application, the data type identification model may be obtained through pre-training by another device, and then the data type identification model is imported into the processor 101, so that the processor 101 identifies the data type of the to-be-compressed data based on the data type identification model.

Optionally, after an internal weight of the data type identification model is optimized by training the sample data, the data type identification model may be further verified based on some sample data, to check whether the data type identification model obtained through training is reliable, and parameters, such as a quantity of iterations and a learning rate, of the data type identification model are adjusted. The parameters of the data type identification model include the internal weight, a weight ratio, and an accuracy threshold. Because each type of data type identification model may have different prediction capabilities for different data types, in this application, different weights may be allocated to the prediction probabilities of each type of data type identification model based on different accuracy rates.

When identifying the data type of the to-be-compressed data, the processor 101 may first initialize the parameters of the data type identification model, and then input the to-be-compressed data into the data type identification model to obtain probabilities of a plurality of data types. The processor 101 may determine, as the data type of the to-be-compressed data, a data type corresponding to a probability that is greater than the accuracy threshold and that is in the probabilities of the plurality of data types.

For example, the processor 101 inputs the to-be-compressed data into the data type identification model, and may obtain a probability of the text type, a probability of the picture type, a probability of the video type, a probability of the gene type, a probability of the executable-program type, a probability of the virtual-hard-disk type, a probability of the database type, and a probability of the another type. If the probability of the text type is greater than the accuracy threshold, the processor 101 determines that the data type of the to-be-compressed data is the text type.

Optionally, if the processor 101 does not identify the data type of the to-be-compressed data, it may be determined that the data type of the to-be-compressed data is the another type.

Figure 4:
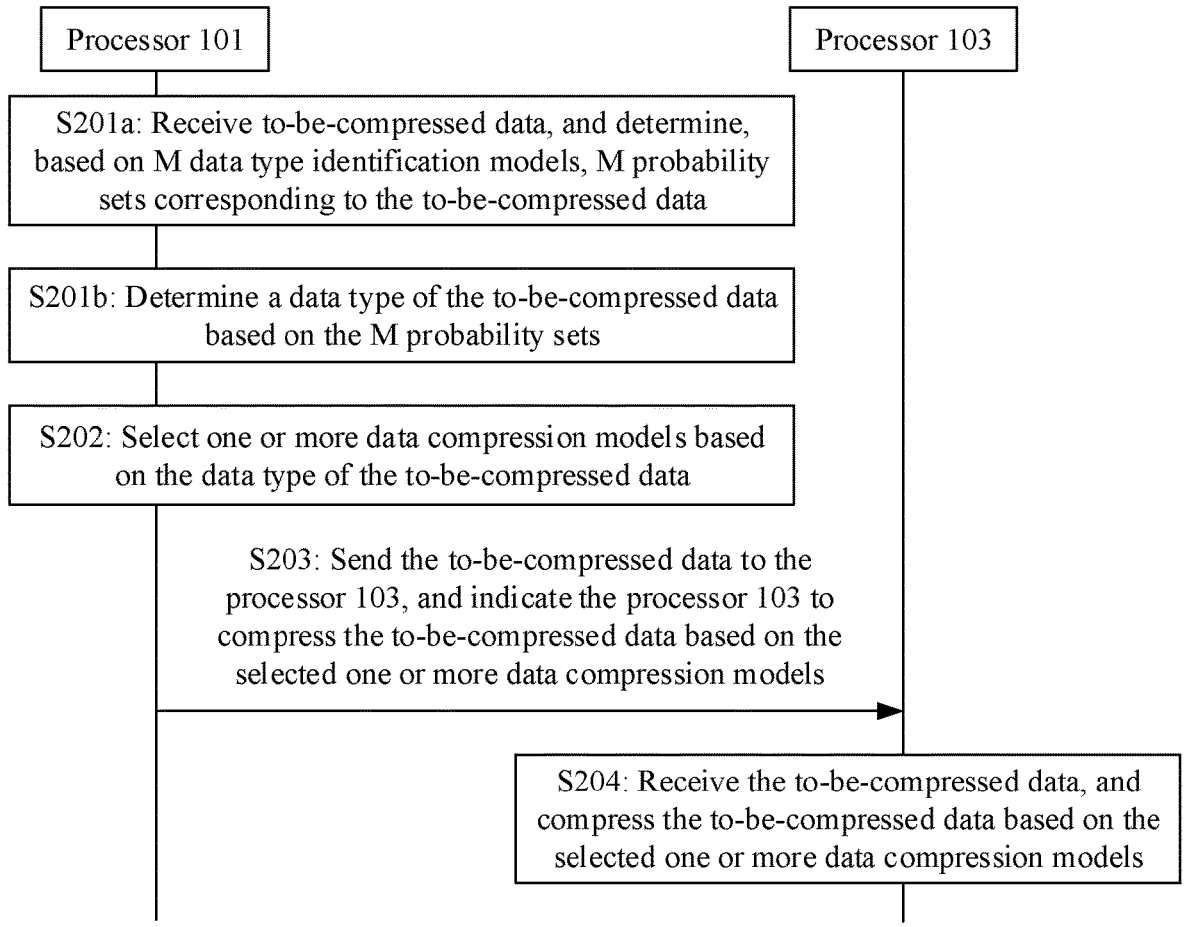
FIG. 4 is a flowchart of a data compression method according to an embodiment of this application.

In some embodiments, to increase an accuracy rate of identifying the data type of the to-be-compressed data, the processor 101 may identify the data type of the to-be-compressed data based on a plurality of data type identification models. For example, as shown in FIG. 4, identifying the data type of the to-be-compressed data may be implemented based on the steps described below. Herein, M data type identification models are used as an example to describe identification of the data type of the to-be-compressed data.

S201a: The processor 101 receives the to-be-compressed data, and determines, based on the M data type identification models, M probability sets corresponding to the to-be-compressed data.

It may be understood that the processor 101 separately inputs the to-be-compressed data into the M data type identification models, and each data type identification model outputs one probability set. Each of the M probability sets includes P initial probability values, and each of the P initial probability values is used to indicate a possibility that the to-be-compressed data is of a data type. P indicates a quantity of data types that can be identified by the data type identification models. M is an integer greater than or equal to 1, and P is an integer greater than or equal to 1.

Optionally, data types that can be identified by all of the M data type identification models are the same. It may be understood that, for a same data type, each of the M data type identification models outputs one initial probability value of the data type, and the M data type identification models can output a total of M initial probability values of the data type.

Optionally, the M data type identification models output a total of M×P initial probability values. P initial probability values determined by a same data type identification model may be the same or may be different. Initial probability values that are of a same data type and that are determined by different data type identification models may be the same or may be different. This is not limited.

For example, it is assumed that M=3 and P=6. The processor 101 separately inputs the to-be-compressed data into three data type identification models, and each data type identification model outputs one probability set. That is, three probability sets are obtained. Each of the three probability sets includes six initial probability values. The three data type identification models output a total of 18 (3×6) initial probability values.

S201b: The processor 101 determines the data type of the to-be-compressed data based on the M probability sets.

First, the processor 101 obtains P intermediate values based on the M probability sets and weight ratios of the M data type identification models.

In some embodiments, for a $j^{th}$ data type in P data types, the processor 101 may determine an intermediate value of the $j^{th}$ data type based on M initial probability values corresponding to the $j^{th}$ data type and the weight ratios of the M data type identification models. The intermediate value of the $j^{th}$ data type satisfies the following formula (1):

$$P_j = \sum_{i=1}^{M} W_i^* P_{Mi}, \qquad (1)$$

where j is an integer, and j∈[1,P]; $P_j$ represents the intermediate value of the $j^{th}$ data type; Wi represents a weight ratio of an $i^{th}$ data type identification model; and $P_{Mi}$ represents an initial probability value that is of the $j^{th}$ data type and that is output by the $i^{th}$ data type identification model.

It may be understood that, after determining an intermediate value of each of the P data types, the processor 101 obtains the intermediate values of the P data types. Optionally, the intermediate values of the P data types may be the same or may be different. This is not limited.

Further, the processor 101 determines the data type of the to-be-compressed data based on the accuracy threshold and the intermediate values of the P data types. For example, the processor determines, as the data type of the to-be-compressed data, a data type corresponding to an intermediate value that is in the intermediate values of the P data types and that is greater than the accuracy threshold.

S202: The processor 101 selects one or more data compression models based on the data type of the to-be-compressed data.

Generally, different data compression models may be designed for different data types. Therefore, the data compression models may be classified based on the different data types. A correspondence between a data type and a data compression model may be predefined. In some embodiments, the correspondence between the data type and the data compression model is pre-stored in the memory 102. After determining the data type, the processor 101 may first invoke the correspondence between the data type and the data compression model from the memory 102, and then obtain the one or more data compression models from the correspondence between the data type and the data compression model based on the data type of the to-be-compressed data. The correspondence between the data type and the data compression model includes a correspondence between the data type of to-be-compressed data and the one or more data compression models.

For example, it is assumed that the data type of the to-be-compressed data is the text type. The processor 101 determines, based on the text type, that data compression models corresponding to the text type include a text model, a word model, and a nest model.

S203: The processor 101 sends the to-be-compressed data to the processor 103, and indicates the processor 103 to compress the to-be-compressed data based on the selected one or more data compression models.

The processor 101 may indicate, by sending indication information, the processor 103 to compress the to-be-compressed data based on the selected one or more data compression models.

In some embodiments, the data compression model has an identifier. The indication information includes the to-be-compressed data and an identifier of the selected data compression model. The processor 103 stores a correspondence between a data compression model and an identifier of the data compression model. After receiving the indication information, the processor 103 may obtain the data compression model based on the identifier of the data compression model.

In other embodiments, the one or more data compression models selected by the processor 101 based on the data type of the to-be-compressed data may be considered as a data compression model set. The data compression model set has an identifier. The indication information includes the to-be-compressed data and the identifier of the data compression model set. The processor 103 stores a correspondence between the data compression model set and the identifier of the data compression model set. After receiving the indication information, the processor 103 may obtain the data compression model set based on the identifier of the data compression model set. In other words, the processor 103 obtains the one or more data compression models corresponding to the data type of the to-be-compressed data.

S204: The processor 103 receives the to-be-compressed data, and compresses the to-be-compressed data based on the selected one or more data compression models.

It may be understood that several data compression models are pre-configured in the processor 103. After determining the one or more data compression models based on the one or more identifiers of the one or more data compression models, the processor 103 obtains the one or more data compression models from the several preset data compression models.

The processor 103 first determines a probability of each bit in the to-be-compressed data based on the one or more data compression models, and then encodes the to-be-compressed data based on the probability of each bit in the to-be-compressed data and an arithmetic encoding algorithm to obtain the compressed data.

In some embodiments, it is assumed that the processor 103 compresses the to-be-compressed data based on N data compression models, where N is an integer greater than or equal to 1. The processor 103 may determine, based on the N data compression models, N probability sets corresponding to the to-be-compressed data, and determine the probability of each bit in the to-be-compressed data based on the N probability sets.

The processor 103 separately inputs the to-be-compressed data into the N data compression models, and each data compression model outputs one probability set. Each of the N probability sets includes Q initial probability values. Each of the Q initial probability values is used to indicate an initial probability value of one bit in the to-be-compressed data. Q represents a quantity of bits included in the to-be-compressed data, and Q is an integer greater than or equal to 1.

It may be understood that for a same bit, each of the N data compression models outputs one initial probability value of the bit, and the N data compression models can output a total of N initial probability values of the bit.

It should be noted that the initial probability value is preset for the data compression model. For example, the initial probability value is an initial value of a probability that the data compression model predicts that a bit is 1. For a first bit in the to-be-compressed data, the data compression model may predict an initial probability value of the first bit based on the initial probability value. For a second bit in the to-be-compressed data, the data compression model may predict an initial probability value of the second bit based on the initial probability value of the first bit. It may be understood that for a $(y+1)^{th}$ bit in the to-be-compressed data, the data compression model may predict an initial probability value of the $(y+1)^{th}$ bit based on an initial probability value of a $y^{th}$ bit. An initial probability value of each bit in the to-be-compressed data is obtained by analogy, where y is an integer, and $y \in [1,Q]$.

Optionally, the N data compression models output a total of N× Q initial probability values. Q initial probability values determined by a same data compression model may be the same or may be different. Initial probability values that are of a same bit and that are determined by different data compression models may be the same or may be different. This is not limited.

For example, it is assumed that N=3 and Q=6. The processor 103 separately inputs the to-be-compressed data into three data compression models, and each data compression model outputs one probability set. That is, three probability sets are obtained. Each of the three probability sets includes six initial probability values. The three data compression models output a total of 18 (3×6) initial probability values.

It should be noted that the initial probability value of the $y^{th}$ bit may be determined by the processor 103 based on an initial probability value of a $(y-1)^{th}$ bit. In other words, the initial probability value of the $y^{th}$ bit may be obtained by the processor 103 through prediction based on the initial probability value of the $(y-1)^{th}$ bit. Alternatively, the processor 103 may predict the initial probability value of the $(y+1)^{th}$ bit based on the initial probability value of the $y^{th}$ bit.

Further, the processor 103 obtains the probability of each bit in the to-be-compressed data based on the N probability sets and weight ratios of the N data compression models.

In some embodiments, for a $y^{th}$ bit in Q bits, the processor 103 may determine a probability of the $y^{th}$ bit based on N initial probability values corresponding to the $y^{th}$ bit and weight ratios of the N data compression models. The probability of the $y^{th}$ bit satisfies the following formula (2):

$$P_y = \sum_{x=1}^{N} Sx^* P_{Nx}, \quad (2)$$

where
y is an integer, and $y \in [1,Q]$; $P_y$ represents the probability of the $y^{th}$ bit; Sx represents a weight ratio of an $x^{th}$ data compression model; and $P_{Nx}$ represents an initial probability value that is of the $y^{th}$ bit and that is output by the $x^{th}$ data compression model.

Optionally, probabilities of the Q bits may be the same or different. This is not limited.

It should be noted that, when a probability of a bit included in the to-be-compressed data is predicted, a parameter of the data compression model may be continuously adjusted based on an existing predicted value, to obtain a more accurate probability of the bit. For example, a neural network may be used to train the weight ratio of the data compression model, to obtain a more accurate weight ratio and further obtain a more accurate probability of the bit.

For example, an initial weight ratio of the data compression model is preset in the data compression model. For example, the initial weight ratio is a weight ratio of a probability that the data compression model predicts that a bit is 1. The weight ratio of the data compression model is adjusted when each time one bit is predicted based on the data compression model. For the first bit in the to-be-compressed data, the data compression model may determine the probability of the first bit based on N initial probability values corresponding to the first bit and initial weight ratios of the N data compression models. For the second bit in the to-be-compressed data, the data compression model may determine a probability of the second bit based on N initial probability values corresponding to the second bit and adjusted weight ratios of the N data compression models. It may be understood that a weight ratio used by the data compression model to predict a probability of the $(y+1)^{th}$ bit may be a weight ratio adjusted after the data compression model predicts the probability of the $y^{th}$ bit.

Compared with a conventional technology in which the processor compresses the to-be-compressed data based on all data compression models, resulting in extremely high memory overheads and time overheads. In the data compression method provided in this embodiment of this application, the processor 101 screens the one or more data compression models based on the data type of the to-be-compressed data to reduce a quantity of data compression models used in a data compression process, so as to further reduce duration for predicting a probability of the to-be-compressed data and reduce memory overheads and time overheads for performing data compression through arithmetic encoding. Further, because the data compression process is offloaded to the processor 103 for execution, compression performance of arithmetic encoding is effectively improved.

The following uses the text data as an example to describe the data compression method provided in this embodiment of this application.

Here, the sample data is used to train and verify the naïve Bayesian model, the extreme gradient boosting decision tree model, and the multilayer perceptron model, to obtain internal weights of the three models, weight ratios of the models, and an accuracy threshold. It is assumed that the weight ratio of the naïve Bayesian model is 0.4, the weight ratio of the extreme gradient boosting decision tree model is 0.1, the weight ratio of the multilayer perceptron model is 0.5, and the accuracy threshold is 0.8. The data types of the sample data include the text type, the picture type, the video type, the gene type, the database type, and the another type. For ease of description, M1 represents the naïve Bayesian model, M2 represents the extreme gradient boosting decision tree model, and M3 represents the multilayer perceptron model. W1 is used to represent the weight ratio of the naïve Bayesian model. W2 is used to represent the weight ratio of the extreme gradient boosting decision tree model. W3 is used to represent the weight ratio of the multilayer perceptron model.

When identifying a data type of the text data, the processor 101 separately inputs the text data into the naïve Bayesian model, the extreme gradient boosting decision tree model, and the multilayer perceptron model, and each model outputs initial probability values of six data types, as shown below:

$P_{M1} = \{P_{text}=0.8, P_{picture}=0.05, P_{video}=0.02, P_{gene}=0.03, P_{database}=0.01, P_{another\ type}=0.09\}$;

$P_{M2}\ \{P_{text}=0.6, P_{picture}=0.1, P_{video}=0.02, P_{gene}=0.08, P_{database}=0.0, P_{another\ type}=0.2\}$; and $P_{M3} = \{P_{text}=0.9, P_{picture}=0.02, P_{video}=0.01, P_{gene}=0.0, P_{database}=0.02, P_{another\ type}=0.05\}$.

$P_{M1}$ represents a probability set output by the naïve Bayesian model. $P_{M2}$ represents a probability set output by the extreme gradient boosting decision tree model. $P_{M3}$ represents a probability set output by the multilayer perceptron model. $P_{text}$ represents an initial probability value of the text type. $P_{picture}$ represents an initial probability value of the picture type. $P_{video}$ represents an initial probability value of the video type. $P_{gene}$ represents an initial probability value of the gene type. $P_{database}$ represents an initial probability value of the database type. $P_{another\ type}$ represents an initial probability value of the another type.

The processor 101 calculates an intermediate value of each data type based on the weight ratios of the data type identification models. The intermediate value satisfies the following formula (3):

$$P = W1 \times P_{M1} + W2 \times P_{M2} + W3 \times P_{M3} \quad (3)$$

An intermediate value of the text type is P1=0.4×0.8+0.1×0.6+0.5×0.9=0.83.

An intermediate value of the picture type is P2=0.4×0.05+0.1×0.1+0.5×0.02=0.04.

An intermediate value of the video type is P3=0.4×0.02+ 0.1×0.02+0.5×0.01=0.015.

An intermediate value of the gene type is P4=0.4×0.03+ 0.1×0.08+0.5×0.0=0.02.

An intermediate value of the database type is P5=0.4× 0.01+0.1×0.0+0.5×0.02=0.014.

An intermediate value of the another type is P6=0.4× 0.09+0.1×0.2+0.5×0.05=0.081.

The processor 101 determines, based on the accuracy threshold, that the intermediate value of the text type in the foregoing six intermediate values is greater than 0.8 (P1=0.85). Therefore, the data type of the input data is the text type.

In some embodiments, Table 1 may be queried to obtain data compression models corresponding to the text type based on the text type. The data compression models corresponding to the text type include the text model, the word model, and the nest model.

After determining the text type, the processor 101 sends the to-be-compressed data to the processor 103, and indicates the processor 103 to compress the to-be-compressed data based on the data compression models corresponding to the text type. It is assumed that the text model predicts that an initial value of a probability that a next bit is 1 is 0.5, the word model predicts that the initial value of the probability that the next bit is 1 is 0.5, and the nest model predicts that the initial value of the probability that the next bit is 1 is 0.2. An initial weight ratio of the text model is 0.33, an initial weight ratio of the word model is 0.33, and an initial weight ratio of the nest model is 0.34. The to-be-compressed data is 01001101. It may be understood that the to-be-compressed data includes eight bits, in other words, Q=8; and y is an integer and y∈[1,8]. When the processor 103 reads the $y^{th}$ bit, probabilities that are predicted by the three models and that the $y^{th}$ bit is 1 are updated, and the updated probabilities of the bit are shown in the following Table 2.

TABLE 2

| Model probability prediction | Initial value | Read the first bit 0 | Read the second bit 1 | Read the third bit 0 | Read the fourth bit 0 | Read the fifth bit 1 | Read the sixth bit 1 | Read the seventh bit 0 | Read the eighth bit 1 |
|---|---|---|---|---|---|---|---|---|---|
| $P_{N1}$ | 0.5 | 0.2 | 0.8 | 0.2 | 0.15 | 0.75 | 0.8 | 0.2 | 0.8 |
| $P_{N2}$ | 0.5 | 0.3 | 0.5 | 0.4 | 0.3 | 0.43 | 0.5 | 0.44 | 0.5 |
| $P_{N3}$ | 0.2 | 0.8 | 0.2 | 0.3 | 0.85 | 0.7 | 0.15 | 0.8 | 0.3 |

Similarly, adjustment of a weight ratio of each model is shown in the following Table 3.

TABLE 3

| Mixer weight ratio | Initial value | Read the first bit 0 | Read the second bit 1 | Read the third bit 0 | Read the fourth bit 0 | Read the fifth bit 1 | Read the sixth bit 1 | Read the seventh bit 0 | Read the eighth bit 1 |
|---|---|---|---|---|---|---|---|---|---|
| S1 | 0.33 | 0.15 | 0.1 | 0.05 | 0.15 | 0.1 | 0.15 | 0.1 | 0.05 |
| S2 | 0.33 | 0.25 | 0.2 | 0.15 | 0.15 | 0.2 | 0.1 | 0.1 | 0.15 |
| S3 | 0.34 | 0.6 | 0.7 | 0.8 | 0.7 | 0.7 | 0.75 | 0.8 | 0.8 |

The processor 103 synthesizes initial probability values that are of the bits and that are calculated based on the three data compression models, to obtain a probability of each bit in the to-be-compressed data. The probability of each bit satisfies the following formula (4):

$$P = S1 \times P_{N1} + S2 \times P_{N2} + S3 \times P_{N3} \qquad (4)$$

The probability that the next bit is 1 is shown in the following Table 4.

TABLE 4

| Output probability | Initial value | Read the first bit 0 | Read the second bit 1 | Read the third bit 0 | Read the fourth bit 0 | Read the fifth bit 1 | Read the sixth bit 1 | Read the seventh bit 0 | Read the eighth bit 1 |
|---|---|---|---|---|---|---|---|---|---|
| ΣS × P | 0.398 | 0.585 | 0.32 | 0.31 | 0.6625 | 0.651 | 0.2825 | 0.704 | 0.355 |

Optionally, the processor 103 may perform weighting calculation on a plurality of initial probability values based on an artificial neural network to obtain a probability. The artificial neural network includes but is not limited to, a long short-term memory (LSTM) model, a gated recurrent unit (GRU) model, a full connection (FC) model, or another neural network model. Therefore, the more accurate probability of the bit may be obtained by synthesizing the plurality of initial probability values based on the artificial neural network, to increase a compression rate of the to-be-compressed data.

The processor 103 encodes the to-be-compressed data based on the probability of each bit in the to-be-compressed data and the arithmetic encoding algorithm, to obtain an arithmetic-coded range, as shown in the following Table 5.

TABLE 5

| Input bit | 0 | 01 | 010 | 0100 |
|---|---|---|---|---|
| Arithmetic-coded range | [0, 0.602] | [0.2498, 0.602] | [0.2498, 0.4893056] | [0.2498, 0.415068164] |
| Input bit | 01001 | 010011 | 0100110 | 01001101 |
| Arithmetic-coded range | [0.30559788035, 0.415068164] | [0.34380300934385, 0.415068164] | [0.34380300934385, 0.39493575780963763] | [0.3589383028897231, 0.39493575780963763] |

The processor 103 determines the compressed data according to the following formula (5):

$$z1 \leq c \times 2^{(-b)} < (c+1) \times 2^{(-c)} \leq z2 \quad (5),$$

where c is an integer, b is a minimum quantity of bits, z1 is a lower limit range of a probability of a bit, and z2 is an upper limit range of the probability of the bit. It is assumed that the probability that the predicted bit is 1 is P. If a read bit is 1, a lower limit $z1=z1+(1-P)\times(z2-z1)$ is updated. If the read bit is 0, an upper limit $z2=z1+(1-P)\times(z2-z1)$ is updated.

In this case, a found minimum value b is 6, and an obtained value of c is 23. A final output encoded value is a binary value of 23, in other words, the compressed data is 010111.

When context matching information is predicted, the parameter of the data compression model needs to be continuously adjusted based on an existing probability and updated context information, to output a more accurate predicted probability value.

In an example, the processor 103 predicts the next bit based on currently consecutive bits, and information about a current bit and a quantity n of times of the current bit are required. The quantity n of times indicates a quantity of times that a bit that is the same as the current bit and that continuously appears previously. When n is larger, a probability that the next bit is the same as the current bit is higher. Each time when the current bit is different from previous consecutive bits, the information about the current bit is updated and the quantity n of times of the current bit are also updated to 1.

It is assumed that a current $y^{th}$ bit is 0, and three consecutive bits are 0, in other words, n=3. After the processor 103 predicts that a probability that the $(y+1)^{th}$ bit is 1 is 0.3, and writes the probability into an arithmetic coder. When the probability of reading the $(y+1)^{th}$ bit is 0, the information that is about the current bit and that is required in the data compression model remains unchanged, and the quantity n of times is updated to 4. When a probability that a $(y+2)^{th}$ bit is 1 is predicted, the probability changes to 0.25. Because a quantity of occurrences of a previous bit 0 increases, a probability that the predicted bit is 0 increases, and the probability that the predicted bit is 1 decreases correspondingly. If the probability of reading the $(y+1)^{th}$ bit is 1, the current bit is updated to 1, and n is also updated to 1. When the probability that the $(y+2)^{th}$ bit is 1 is predicted, the probability increases to 0.55.

In some embodiments, a probability update module may continuously update, based on a currently read bit, feature information required by a probability prediction module, to ensure accuracy of predicting a next bit by the probability prediction module.

A probability mixing module may synthesize initial probability values that are of bit and that are calculated based on a plurality of probability statistics models, to obtain a most accurate probability of the bit. The probability mixing module may perform weighting calculation on the plurality of initial probability values based on the neural network to obtain the probability of the bit. The neural network includes but is not limited to the long short-term memory model, the gated recurrent unit, the full connection model, or the another neural network model.

An arithmetic encoding module performs an arithmetic encoding operation on the obtained probability of each bit to implement data compression. The arithmetic encoding operation is complex, has relatively high calculation overheads, and is closely combined with a probability statistics module. To reduce the calculation overheads, an arithmetic compression algorithm is encoded based on a per bit, and using hardware to execute the arithmetic encoding module has very high efficiency. Contrary to a compression process, original data is calculated based on an arithmetic decoder in a decompression phase. In a compression phase, the parameters of the data compression model are stored in encoded data (for example, the data compression model corresponding to the data type). In a decoding phase, only the data compression model needs to be used, and the data type identification model does not need to be used. Therefore, a decompression process is faster than the compression process. The arithmetic encoding module may be implemented by the arithmetic coder, and the arithmetic coder may be located in the processor 103.

In other embodiments, after the processor 101 receives the to-be-compressed data, the processor 101 identifies the data type of the to-be-compressed data, and selects the one or more data compression models based on the data type. In addition, the processor 101 compresses the to-be-compressed data based on the selected one or more data compression models. A difference from the foregoing embodiment lies in that the processor 103 does not need to compress the to-be-compressed data based on the selected one or more data compression models. For a specific method for selecting the one or more data compression models and a specific method for compressing the to-be-compressed data, refer to the descriptions in the foregoing embodiments. Details are not described again.

In other embodiments, the several data compression models may be stored in the processor 103. The processor 103 obtains the probability of each bit in the to-be-compressed data based on the several data compression models, and encodes the to-be-compressed data based on the probability of each bit in the to-be-compressed data and the arithmetic encoding algorithm, to obtain the compressed data. The several data compression models include the commonly used data compression models in all the data compression models in the conventional technology and another data compression model generated by combining the commonly used data compression models. For the specific method for compressing the to-be-compressed data, refer to the descriptions in the foregoing embodiments. Details are not described again.

It may be understood that, to implement the functions in the foregoing embodiments, the computing device includes a corresponding hardware structure and/or software module for performing each function. A person skilled in the art should easily be aware that, in combination with the examples described in the embodiments disclosed in this application, units and method steps may be implemented by hardware or a combination of hardware and computer software. Whether a function is performed by hardware or hardware driven by computer software depends on particular application scenarios and design constraints of the technical solutions.

Figure 5:
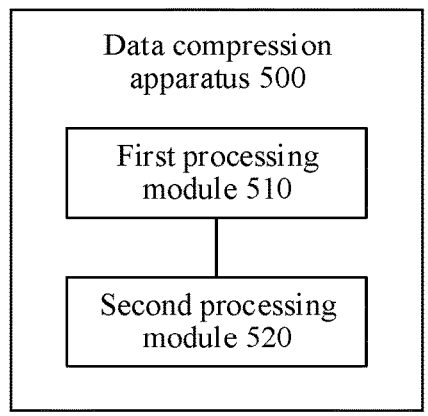
FIG. 5 is a schematic composition diagram of a data compression apparatus according to an embodiment of this application.

FIG. 5 is a schematic structural diagram of a possible data compression apparatus according to an embodiment of this application. The data compression apparatus may be configured to implement functions of the computing device in the foregoing method embodiments. Therefore, the data compression apparatus can also implement beneficial effects of the foregoing method embodiments. In this embodiment of this application, the data compression apparatus may be the computing device 100 shown in FIG. 1, or may be a module (for example, a chip) used in the computing device.

As shown in FIG. 5, a data compression apparatus 500 includes a first processing module 510 and a second processing module 520. The data compression apparatus 500 is configured to implement the functions of the computing device in the method embodiment shown in FIG. 2 or FIG. 4.

When the data compression apparatus 500 is configured to implement the functions of the computing device in the method embodiment shown in FIG. 2, the first processing module 510 is configured to perform S201 to S203, and the second processing module 520 is configured to perform S204.

When the data compression apparatus 500 is configured to implement the functions of the computing device in the method embodiment shown in FIG. 4, the first processing module 510 is configured to perform S201a, S201b, S202, and S203, and the second processing module 520 is configured to perform S204.

For more detailed descriptions of the first processing module 510 and the second processing module 520, directly refer to related descriptions in the method embodiment shown in FIG. 2 or FIG. 4. Details are not described herein again.

For example, in a specific product implementation, the first processing module 510 may be the processor 101 shown in FIG. 1, and the second processing module may be the processor 103 shown in FIG. 1. In another example, the first processing module 510 and the second processing module 520 may be two components having a computing capability, or may be two computing units in a same component. An organization form between the first processing module 510 and the second processing module 520 is not limited in this embodiment.

In the embodiments of this application, unless otherwise stated or there is a logic conflict, terms and/or descriptions between different embodiments are consistent and may be mutually referenced, and technical features in different embodiments may be combined based on an internal logical relationship thereof, to form a new embodiment.

In this application, "at least one" means one or more, and "a plurality of" means two or more. The term "and/or" describes an association relationship for describing associated objects and represents that three relationships may exist. For example, A and/or B may represent the following cases: Only A exists, both A and B exist, and only B exists, where A and B may be singular or plural. In the text descriptions of this application, the character "/" indicates an "or" relationship between the associated objects. In a formula in this application, the character "/" indicates a "division" relationship between the associated objects.

It may be understood that various numbers in the embodiments of this application are merely used for differentiation for ease of description, and are not used to limit the scope of the embodiments of this application. Sequence numbers of the foregoing processes do not mean execution sequences. The execution sequences of the processes should be determined based on functions and internal logic of the processes.

What is claimed is:

1. A data compression method performed by a computing device, comprising:
receiving, by a first processor of the computing device, to-be-compressed data;
obtaining, by the first processor of the computing device, M data type identification models;
determining, by the first processor of the computing device, M probability sets corresponding to the to-be-compressed data based on the M data type identification models;
identifying, by the first processor of the computing device, a data type of the to-be-compressed data by obtaining P intermediate values based on the M probability sets and weight ratios of the M data type identification models, the data type of the to-be-compressed data corresponding to an intermediate value in the P intermediate values and that is greater than an accuracy threshold, the data type including a text type, a picture type, or a video type;
selecting, by the first processor of the computing device, a data compression model based on the data type;
sending, by the first processor of the computing device, the to-be-compressed data and information related to the selected data compression model to a second processor of the computing device;
compressing, by the second processor of the computing device, the to-be-compressed data to obtain compressed data based on the selected data compression model; and sending, by the second processor of the computing device, the compressed data to the first processor of the computing device.

2. The method according to claim 1, further comprising:
training first sample data to generate multiple data compression models; and
storing the multiple data compression models, wherein the selected data model is a subset of the multiple data compression models.

3. The method according to claim 2, further comprising:
upgrading the multiple data compression models stored in the computing device.

4. The method according to claim 1, wherein each data compression model has an identifier, and the method further comprises:
obtaining a corresponding data compression model based on the identifier.

5. The method according to claim 1, further comprising:
storing a correspondence between the data type of the to-be-compressed data and the one or more data compression models in the computing device.

6. The method according to claim 1, wherein each data type identification model is used to identify occurrence probabilities of P data types; and
wherein each probability set comprises P initial probability values, each of the P initial probability values is used to indicate a possibility that the to-be-compressed data is of a data type, M is an integer greater than or equal to 1, and P is an integer greater than or equal to 1.

7. The method according to claim 6, further comprising:
training second sample data to generate the M data type identification models.

8. A computing device, comprising:
a plurality of processors including a first processor and a second processor, wherein the first processor is configured to:
receive to-be-compressed data;
obtain M data type identification models;
determine M probability sets corresponding to the to-be-compressed data based on the M data type identification models;
identify a data type of the to-be-compressed data by obtaining P intermediate values based on the M probability sets and weight ratios of the M data type identification models, the data type of the to-be-compressed data corresponding to an intermediate value in the P intermediate values and that is greater than an accuracy threshold, the data type including a text type, a picture type, or a video type;
select a data compression model based on the data type; and
send the to-be-compressed data and information related to the selected data compression model to the second processor, and
wherein the second processor is configured to compress the to-be-compressed data to obtain compressed data based on the selected data compression model, and send the compressed data to the first processor of the computing device.

9. The computing device according to claim 8, wherein the computing device further comprises a memory coupled to the first processor, and the first processor is further configured to store a correspondence between the data type of the to-be-compressed data and the one or more data compression models in the memory.

10. The computing device according to claim 8, wherein the computing device further comprises an artificial intelligence (AI) chip coupled to the first processor, wherein the AI chip is configured to train first sample data to generate multiple data compression models, wherein the selected data compression model is a subset of the multiple data compression models, and wherein the first processor is further configured to store the multiple data compression models in the computing device.

11. The computing device according to claim 10, wherein the first processor or the second processor is further configured to upgrade the multiple data compression models stored in the computing device.

12. The computing device according to claim 8, wherein each data compression model has an identifier, wherein the first processor is further configured to send an identifier of the selected data compression model to the second processor, and wherein the second processor is further configured to obtain a corresponding data compression model based on the identifier.

13. The computing device according to claim 8, wherein each data type identification model is used to identify occurrence probabilities of P data types; and
wherein each probability set comprises P initial probability values, each of the P initial probability values is used to indicate a possibility that the to-be-compressed data is of a data type, M is an integer greater than or equal to 1, and P is an integer greater than or equal to 1.

14. The computing device according to claim 13, further comprising:
an artificial intelligence (AI) chip coupled to the first processor, and the AI chip is further configured to train second sample data to generate the M data type identification models.

15. The computing device according to claim 8, wherein the first processor is a central processing unit, and the second processor is a coprocessor.

* * * * *